US007166845B1

(12) United States Patent
Chai

(10) Patent No.: US 7,166,845 B1
(45) Date of Patent: *Jan. 23, 2007

(54) METHOD OF ENHANCING PERFORMANCE OF CERIUM DOPED LUTETIUM YTTRIUM ORTHOSILICATE CRYSTALS AND CRYSTALS PRODUCED THEREBY

(75) Inventor: Bruce Chai, Sanford, FL (US)

(73) Assignee: Crystal Photonics, Incorporated, Sanford, FL (US)

( * ) Notice: Subject to any disclaimer, the term of this patent is extended or adjusted under 35 U.S.C. 154(b) by 322 days.

This patent is subject to a terminal disclaimer.

(21) Appl. No.: 10/754,850

(22) Filed: Jan. 9, 2004

(51) Int. Cl.
*G01T 1/20* (2006.01)
(52) U.S. Cl. .................................. 250/361 R
(58) Field of Classification Search ............. 250/361 R
See application file for complete search history.

(56) References Cited

U.S. PATENT DOCUMENTS

| | | | |
|---|---|---|---|
| 4,055,391 A | 10/1977 | Schmidt et al. ............. | 432/264 |
| 5,164,041 A | 11/1992 | Berkstresser et al. ....... | 156/617 |
| 5,324,488 A | 6/1994 | Klingshirn et al. .......... | 117/213 |
| 5,481,114 A | 1/1996 | Daniel et al. ........... | 250/390.11 |
| 5,483,070 A | 1/1996 | Valenta ........................ | 250/366 |
| 5,540,947 A | 7/1996 | Morlotti et al. ............... | 427/65 |
| 5,660,627 A | 8/1997 | Manente et al. ............. | 117/13 |
| 5,690,731 A | 11/1997 | Kurata et al. ................. | 117/13 |
| 6,323,489 B1 * | 11/2001 | McClellan ............. | 250/361 R |
| 6,462,341 B1 | 10/2002 | Muehllehner .......... | 250/363.03 |
| 6,624,420 B1 | 9/2003 | Chai et al. .............. | 250/361 R |
| 6,643,538 B1 | 11/2003 | Majewski et al. .......... | 600/436 |
| 6,664,543 B2 | 12/2003 | Moyers et al. ............... | 250/369 |
| 6,671,541 B2 | 12/2003 | Bishop et al. .............. | 600/436 |
| 6,822,237 B2 | 11/2004 | Inoue et al. ........... | 250/363.06 |
| 6,903,344 B2 | 6/2005 | Breeding et al. ....... | 250/363.03 |
| 6,921,901 B1 | 7/2005 | Chai et al. .............. | 250/361 R |
| 6,995,374 B2 | 2/2006 | Lefaucheur et al. ... | 250/370.11 |
| 2002/0144640 A1 | 10/2002 | Andreaco et al. .............. | 117/2 |
| 2004/0084655 A1 | 5/2004 | Vartuli et al. ............ | 252/301.4 |

OTHER PUBLICATIONS

Kobayashi et al., Abstract of "Radiation damage of cerium-doped lutetium oxyorthosilicate single crystal," Nuclear Instruments & Methods in Physics Rsearch, Section A: Accelerators, Spectrometers, Detectors, and Associated Equipment (1993), 335 (3), 509-12.
Chen et al., Proceedings of the International Conference on Inorganic Scintillators and Their Applications, pp. 185-188, SCINT95, 1996, Delft University Press, The Netherlands.

(Continued)

*Primary Examiner*—David Porta
*Assistant Examiner*—Djura Malevic
(74) *Attorney, Agent, or Firm*—Allen, Dyer, Doppelt, Milbrath & Gilchrist, P.A.

(57) ABSTRACT

A method for enhancing the light yield of a single crystal of cerium doped lutetium yttrium orthosilicate (LYSO) in response to irradiation with high energy radiation includes diffusing oxygen into the crystal by heating the crystal for a period of time in an ambient containing oxygen. This process of thermal oxygenation of the crystal effectively supplies oxygen to fill at least some of the oxygen vacancies in the body of monocrystalline LYSO. A scintillation detector comprises a monocrystalline body of LYSO enhanced by oxygen diffusion into the crystal.

28 Claims, 7 Drawing Sheets

OTHER PUBLICATIONS

Jermann et al., Proceedings of the International Conference on Inorganic Scintillators and Their Applications, pp. 388-391, SCINT95, 1996, Delft University Press, The Netherlands.

Higgins et al., The Influence of Whole Boule Annealing on the Properties of Semi-Insulating Indium Phosphide, Interdisciplinary Research Centre for Semiconductor Materials, London, United Kingdom; presented at the Indium Phosphide and Related Materials (IPRM) Conference, Davos, Switzerland in May 1999.

"Investigation of the Properties of New Scintillator LYSO and Recent LSO Scintillators for Phoswich PET Detectors", 2002 IEEE Nuclear Science Symposium Conference Record, 2002 IEEE Nuclear Science Symposium Conference, Norfolk, VA Nov. 10-16, 2002, IEEE Nuclear Science Symposium Conference Record, Ney York, NY, IEEE, US, vol. 3 of 3, Nov. 10, 2002, pp. 655-660, XP010663616, ISBN: 0-7803-7636-6.

"Crystal Growth and Optical Characterization of Cerium-Doped $Lu_{1.6}Y_{0.2}Sio_5$", Cooke et al., Journal of Applied Physics, American Institute of Physics, NY, US, vol. 88, No. 12, Dec. 15, 2000, pp. 7360-7362, XP012051142, ISSN: 0021-8979.

"High Efficiency of Lutetium Silicate Scintillators Ce-doped LPS and LYSO Crystals", Pidol et al., 2003 IEEE Nuclear Science Symposium Conference Record./ 2003 IEEE Nuclear Symposium and Medical Imaging Conference, Portland, OR, Oct. 19-25, 2003, IEEE Nuclear Science Symposium Conference Record, New York, NY:IEEE, US, vol. 5 of 5, Oct. 19, 2003, pp. 886-890vol. 12, XP010736350, ISBN: 0-7803-8257-9.

* cited by examiner

FIG. 1 (YSO)
(PRIOR ART)

FIG. 2 (LSO)
(PRIOR ART)

METHOD OF ENHANCING PERFORMANCE OF CERIUM DOPED LUTETIUM YTTRIUM ORTHOSILICATE CRYSTALS AND CRYSTALS PRODUCED THEREBY

FIELD OF THE INVENTION

The present invention relates to the field of crystals and, more particularly, to a method of enhancing a crystal of cerium doped lutetium yttrium orthosilicate (LYSO) to generate a greater light yield in response to irradiation with high energy radiation.

BACKGROUND OF THE INVENTION

Single crystal scintillation is a very simple but also very sensitive method of detecting high energy radiation such as x-rays, gamma-rays and high energy particles with energies exceeding a few kilo-electron volt (KeV). In the past century, a large number of crystals have been proposed for potential scintillating applications. For medical imaging such as positron emission tomographs (PET), crystals with the highest light yield, narrowest energy resolution and fastest decay time are required. Moreover, PET also requires a crystal with good physical integrity and chemical inertness. Thallium-activated sodium iodide, NaI(TI) has by far the highest light yield of 38,000 photons per million-electron volt (MeV). Unfortunately, NaI(TI) is hygroscopic which is not a desirable property in making the small detector pixels used in a PET system.

The first crystal used in a PET application was bismuth germanate (BGO), which has the general formula $Bi_4Ge_3O_{12}$. BGO is non-hygroscopic and has good physical properties. The problem of BGO is the relatively low light yield of 6,000 photons per MeV, or approximately 15% of the yield of NaI(TI). BGO also has a long decay time of 300 nano-seconds (ns), which is too slow for the coincident detection employed in a PET system.

A much improved crystal for PET application was developed in the early 1980s. This is cerium doped gadolinium orthosilicate (GSO), which has the general formula $Ce:Gd_2SiO_5$. GSO exhibits the much shorter decay time of 60 ns and a light yield of approximately 10,000 photons per MeV, or 25% that of NaI(TI).

In the early 1990s, cerium doped lutetium orthosilicate (LSO), having the general formula of $Ce:Lu_2SiO_5$, was discovered. LSO had, by far, the best overall properties. The decay time of LSO is only 47 ns and the light yield is 29,000 photons per MeV, or approximately 76% that of NaI(TI). Even though LSO has excellent properties, it is not without problems. One of the most serious problems of LSO is the large variation of light yield from crystal boule to crystal boule and even from top to bottom within the same crystal boule. In the past, this variation has been attributed to impurities within the crystal, which generate color centers and thus quenche the radiative emission.

More recently, Chai et al. in U.S. Pat. No. 6,624,420 described the newest entry in scintillator crystals for PET, that is lutetium yttrium orthosilicate (LYSO) having the general composition of $Ce_{2x}(Lu_{1-y}Y_y)_{2(1-x)}SiO_5$ where x=0.00001 to 0.05 and y=0.0001 to 0.9999. LYSO also has very high light yield up to 96% that of NaI(TI) and a similar fast decay time of 48 ns. At the same time, however, it also suffers the same problem as LSO, that is, a large light yield variation from crystal boule to crystal boule, as well as from the top to the bottom of the same crystal boule, although the variation is much smaller than that of LSO. The inventors attributed the smaller variation in light yield properties of LYSO to the substitution of yttrium, which has much higher purity than the lutetium source.

A large variation in light yield presents a serious problem for the construction of PET detector blocks. Ideally, it is preferred that all pixels within a detector block have the same light yield and energy resolution. Moreover, the spread of the light, or energy resolution is another important parameter in the design of the PET detector blocks. Ideally, it is preferable to have the energy resolution as narrow as possible. At the present time, neither BGO nor GSO suffers from the problem of non-uniformity in light yield and energy resolution. However, for both LSO and LYSO, these are persistent problems.

In the past, in order to provide PET detector blocks using either LSO or LYSO and having uniform performance, it would be necessary to carefully measure the light yield performance and energy resolution of each individual detector pixel. By manually selecting the pixels with nearly the same performance, it would be possible to build detector blocks having uniform performance. This is a very costly manufacturing process, however. To make the product competitive, it became necessary to develop a process which could eliminate this manual selection process and still identify all the detector pixels having the same performance.

Applicant believes, without wishing to be bound thereto, that the poor light yield performance of LSO is due to deep traps which take the energy away and dissipate it non-radiatively. However, very little is known about the exact nature of these non-radiative recombination centers. Since the starting material, $Lu_2O_3$, is only 99.95% in purity, it is believed that poor light yield performance was due to the impurities in the starting material from which the crystal is made. However, repeated chemical analyses of trace elements in both the $Lu_2O_3$ powder starting material and the whole crystal have failed to identify the exact impurity which quenches the light yield. Applicant has also intentionally added trace amounts of impurities in the starting powder mixture and then grown a LSO or LYSO crystal, but this approach failed to show any of the intended results of light quenching.

Even though both LSO and LYSO have the problem of serious light yield variation, Applicant has not found the same effect in cerium doped yttrium orthosilicate single crystal (YSO) having the general formula $Ce:Y_2SiO_5$. Moreover, while LSO has a strong afterglow which can last many hours after being radiated with UV light, Applicant has never observed a similar afterglow of YSO under the same UV radiation conditions. Since the starting material, $Y_2O_3$, for YSO is 99.999% in purity, the evidence tended to support the speculation that the light yield variation is due to the impurity of the $Lu_2O_3$ raw material.

In the development of the LYSO crystal, Applicant has also noticed the enhancement of light yield shown by LYSO over LSO, as well as much weaker afterglow for LYSO crystals with high yttrium content. At that time, this observation also supported the assumption that a high yttrium content LYSO crystal starts with less $Lu_2O_3$ and, therefore, has less impurities and thus better light yield.

Despite the seeming consistency of this pattern as indicating that impurities in the $Lu_2O_3$ raw material were the main cause of light yield reduction, the impurity or impurities which interfere with light yield has never been identified, even though Applicant has used a variety of $Lu_2O_3$ sources from many different vendors having different types and levels of impurities. In fact, the performance of both LSO and LYSO seems to be independent of the source of $Lu_2O_3$. Even when the same batch of chemical is used, it is still possible to have a large variation in light yield from crystal boule to crystal boule. Given those circumstances, Applicant began to suspect that the cause of light yield variation is not really due to the impurity effect but due to other causes which are more fundamental and most likely related to the basic structure of the crystal.

YSO, LSO and LYSO have the same crystal structure, which is monoclinic with a space group of C2/c. The structure has two distinct rare earth cation sites. One is a distorted 7-fold coordinate site and the other one is a smaller distorted 6-fold coordinate site. These two sites are quite different from each other, with distinct energy levels for emission. When the crystal is doped with cerium, the dopant substitutes into both sites. The exact distribution ratio between the two sites is not known. However, since the emission spectra of Ce:LSO (FIG. 1) and Ce:YSO (FIG. 2) are not quite the same, it may be assumed that the Ce distribution between the two sites is different for Ce:LSO and Ce:YSO. For Ce:LYSO, because the crystal has a very high content of Lutetium (at least approximately 95%) and low Yttrium content (approximately less than 5%) the absorption and emission spectra are substantially the same as that of pure LSO.

Single crystals of YSO, LSO and LYSO are all produced by the Czochralski melt pulling technique as known in the art, since all three compositions melt congruently. However, the melting points of all three crystals are quite high, 1980° C., 2150° C. and 210° C., respectively. To hold the molten charges at such high temperatures, it is necessary to use an iridium metal crucible as the container, which has a melting point of 2450° C. Even though iridium is quite inert and stable, it does oxidize in air at such high temperatures. To prevent metal loss of the iridium crucible, it is necessary to grow the crystals in either a vacuum or in furnaces purged with argon or nitrogen gas, so that the ambient oxygen in the growth chamber is kept below approximately 1%.

Even though the crystals grown in this method are colorless and transparent, Applicant theorizes without wishing to be bound thereto that there is some evidence that oxide crystals produced at such high temperatures under a low oxygen condition tension can generate oxygen vacancy point defect centers. These points defect centers could act as recombination centers which take away the radiative energy from an otherwise normal electron-hole recombination process. Even though such oxygen point defect centers are well known, they have not been implicated directly as the possible cause for low light yield in scintillating crystals.

During Applicant's extensive experience growing crystals of LSO, YSO and LYSO over the years, there have been a number of times that accidentally an air leakage developed in a growth chamber. This was highly undesirable, since the iridium crucible was badly burned to a purplish black color. The crystal surface, in those instances, was covered with small single crystal flakes of iridium metal released from the crucible. Generally, the process must be stopped right away to minimize further damage to the crucible and to the furnaces. In most of these cases a partially completed crystal is the result.

In these cases, however, even though LSO, YSO and LYSO all have the same crystallographic structure, the crystals produced under such highly oxygenated conditions are quite different from each other. For YSO, the crystal turns into a light yellow color, indicating oxidation of Ce from the 3+ to the 4+ state. Nevertheless, there is improvement of the light yield in these oxygenated crystals as compared with the regular YSO crystals.

For both LSO and LYSO crystals, the change from colorless to yellow is rarely seen. Most of these crystals are still transparent and colorless, but among these crystals, I noticed a definite improvement in light yield. When grown using the prior process of reduced oxygen, the typical light yield for an LSO crystal is about 4× that of BGO, but occasionally a crystal having 5×BGO light yield may be obtained, although rarely. Surprisingly, however, Applicant discovered that these accidentally air-leaked LSO crystals generally showed 5× or even better light yield over BGO, which is exceptionally good. For LYSO crystals, the results were even better. It was possible to obtain as much as 6× or more the light yield of BGO. Moreover, the improvement appeared to be independent of the source of $Lu_2O_3$. In other words, Applicant theorizes without wishing to be bound thereto that the improvement is unrelated to the degree of original impurities found in the crystal, or to the reduction thereof.

SUMMARY OF THE INVENTION

In view of the foregoing background, it is therefore an object of the present invention to enhance the performance of LYSO crystals.

This and other objects, features and advantages in accordance with the present invention are provided by a method comprising diffusing oxygen into a body of monocrystalline LYSO by heating the body for a period of time in an ambient containing oxygen. The diffusing may be carried out so that the body of monocrystalline LYSO is fully oxygenated, for example. In addition, the diffusing may be carried out so that the cerium is not further oxidized to a 4+ state. If a sufficient amount of cerium is oxidized the monocrystalline body may appear yellow in color, and, moreover, the performance may adversely affected.

The method may also comprise forming the body of monocrystalline LYSO to have at least one dimension no greater than about 20 mm. This may permit more efficient diffusion to thereby reduce production time. The body may have a rod shape or be rectangular, for example.

The oxygen containing ambient may, in some embodiments, comprise air at atmospheric pressure. In other embodiments, the oxygen containing ambient may be at a pressure above atmospheric. The oxygen containing ambient may also have an oxygen concentration higher than in air.

The heating of the body of monocrystalline LYSO may comprise heating the body to a temperature in a range of between about 1100° to 1400° C., and, more preferably at a temperature of approximately 1100° C. The period of time is in a range of about 3 to 120 hours, and, more preferably, in a range of about 3 to 100 hours.

Prior to being enhanced, the LYSO single crystal may consist of $Ce_{2x}(Lu_{1-y}Y_y)_{2(1-x)}SiO_{5-Z}$ where x ranges from approximately 0.00001 to approximately 0.05, y ranges from approximately greater than zero to approximately less than 1.00, and z ranges from greater than zero to less than 5.0.

The diffusing may result in increased performance based upon a light yield of the body of monocrystalline LYSO. Alternately or additionally, the diffusing may result in increased performance based upon an energy resolution of the body of monocrystalline LYSO. Similarly, the diffusing may result in increased performance based upon a full width, half maximum (FWHM) of an energy peak of the monocrystalline LYSO.

Considered in somewhat different terms, the method may be for enhancing performance of a body of monocrystalline cerium doped lutetium yttrium orthosilicate (LYSO) in response to irradiation with high energy radiation, and wherein the body of monocrystalline LYSO having oxygen vacancies therein. The method may comprise supplying oxygen to fill at least some of the oxygen vacancies in the body of monocrystalline LYSO.

Another aspect of the invention is directed to a scintillation detector. The detector may include a monocrystalline body having the general formula of $Ce_{2x}(Lu_{1-y}Y_y)_{2(1-x)}SiO_{5-z}$ where x ranges from approximately 0.00001 to approximately 0.05, and y ranges from approximately greater than 0 to approximately less than 1.00, wherein z is approximately zero. In addition, the monocrystalline body may also have a light yield of greater than approximately six times that of bismuth germanate (BGO). Alternately or additionally, the monocrystalline body may also have a full width, half maximum (FWHM) of an energy peak of the monocrystalline LYSO of not greater than about 10% of the energy peak position. Thus, the monocrystalline body may also have an energy resolution which is approximately 10% improved over a crystal which has not been enhanced according to the invention. The scintillation detector may also include a photon detector coupled to the monocrystalline body.

DETAILED DESCRIPTION OF THE PREFERRED EMBODIMENTS

Figure 1:
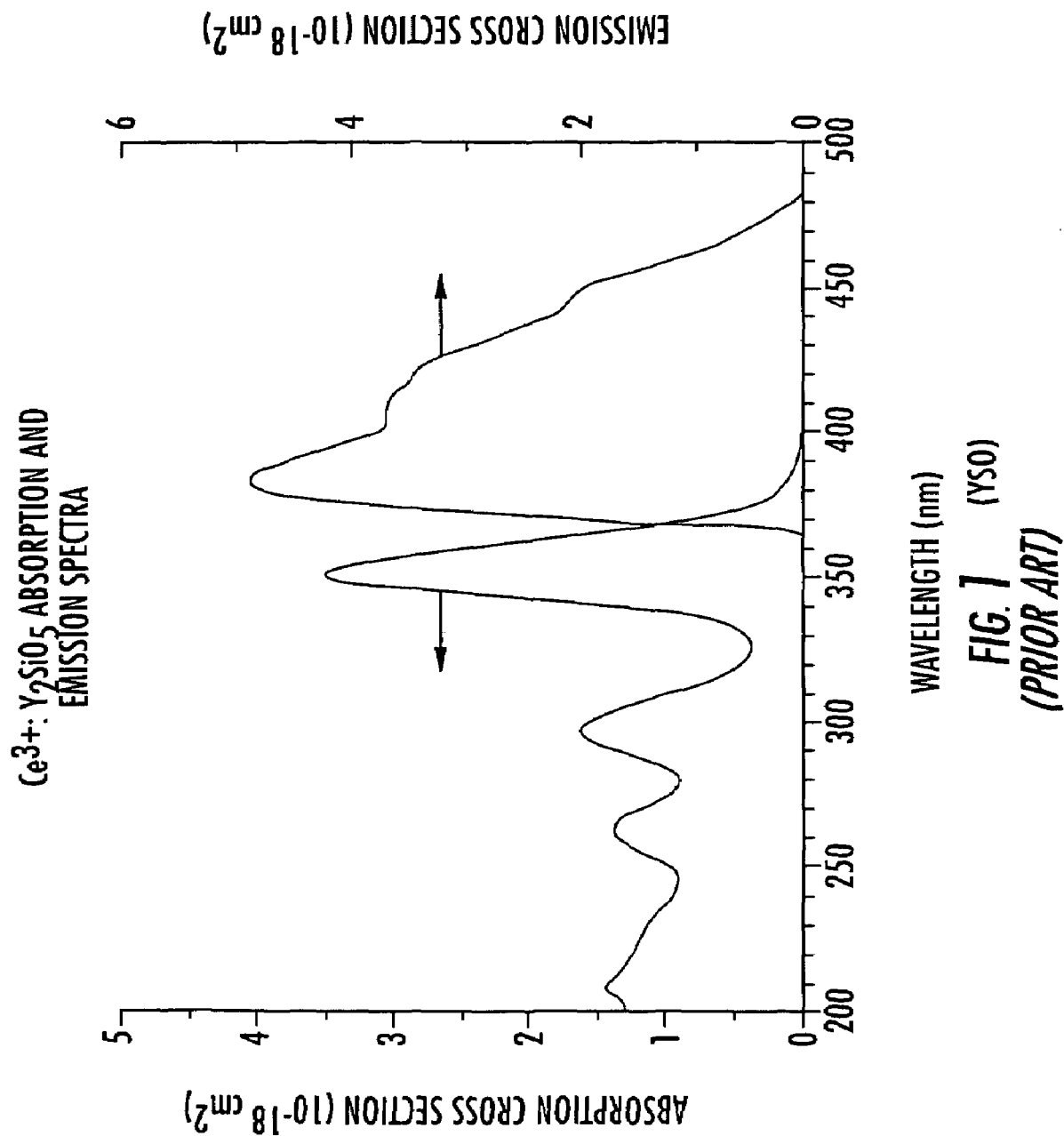
FIG. 1 is a line graph showing the absorption and emission spectra of YSO, as in the prior art.
Figure 2:
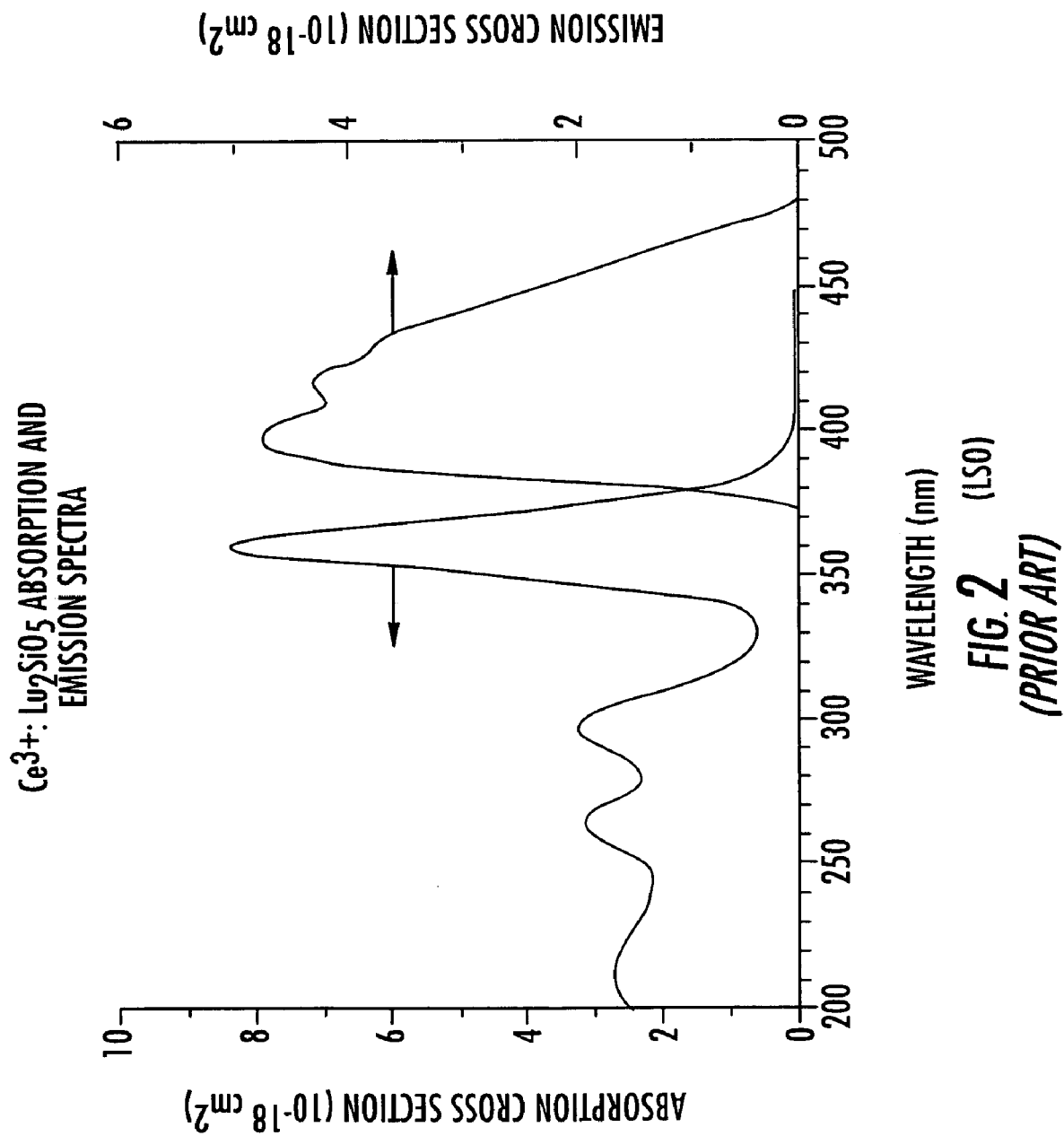
FIG. 2 shows a line graph depicting the absorption and emission spectra of LSO, as in the prior art.

The present invention will now be described more fully hereinafter with reference to the accompanying drawings, in which preferred embodiments of the invention are shown. Unless otherwise defined, technical and scientific terms used herein have the same meaning as commonly understood by one of ordinary skill in the art to which this invention pertains. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including any definitions, will control. In addition, the materials, methods and examples given are illustrative in nature only and not intended to be limiting. Accordingly, this invention may be embodied in many different forms and should not be construed as limited to the illustrated embodiments set forth herein. Rather, these illustrated embodiments are provided solely for exemplary purposes so that this disclosure will be thorough and complete, and will fully convey the scope of the invention to those skilled in the art. Other features and advantages of the invention will be apparent from the following detailed description, and from the claims.

For illustrative purposes, a representative embodiment of the invention is described hereafter in the context of the detection of high energy gamma rays. It should be understood that the oxygenated LYSO single crystal scintillator of the invention is not limited to the detection of gamma ray radiation but it has general applications for the detection of other types of radiation such as x-rays, cosmic and other high energy particle rays.

In the background review, it is noted that Ce doped LYSO has superior scintillating properties among known non-hygroscopic scintillators. It also includes its two end members, YSO where y=1.00 and LSO where y=0. A previously recognized problem with this family of compounds is the large variation of the light yield from crystal to crystal and even from top to bottom in the same crystal boule. It now appears that these variations are not primarily due to impurities within the crystal but, rather, are related to the oxygenation state of the material. Crystals that are highly oxygenated usually produce a much higher light yield than crystals having oxygen vacancies within their structure.

The present invention includes a process which can oxygenate the crystal and thus greatly improve its light yield performance. These crystals are produced by the Czochralski melt pulling technique known in the art, using an iridium crucible at extremely high temperatures which are near or exceed 2000° C. Therefore, in order to prevent excessive oxidation and corrosion of the iridium crucible, it is typically desired to reduce the content of oxygen within the growth chamber. All crystals typically produced through this prior art technique are made under low oxygen conditions. As a result, based on experimental observations Applicant theorizes without wishing to be bound thereto, that these conventionally produced crystals are formed having oxygen vacancy point defects within the crystal lattice. Unfortunately, this oxygen defect condition has been previously overlooked by those of skill in this art. Applicant believes this problem has not been recognized before because crystals having oxygen vacancy defects are visually unremarkable, that is, there is no visual clue that there may be something about the crystal that is less than optimal. Since the traditional concept of the impurity effect on crystal performance is deeply rooted in the art, and the $Lu_2O_3$ starting chemicals are not completely pure, it was easy to assume that impurities are the primary cause of the reduction in the light yield produced by these crystals. Thus, the problem and its solution continued unrecognized until now.

Having realized that low light yield in these crystals may be directly related to oxygen vacancy defects in the crystal, it became necessary to develop a process for producing crystals without the defect. It was also clear that increasing the oxygen concentration during formation of the crystals may lead to damage of the iridium crucible due to uncontrolled oxidation at the high temperatures used for crystal formation.

Thus, the present invention provides a method of oxygenating these crystals, to reduce or eliminate the oxygen vacancy point defects and to restore the intrinsic light yield characteristics of YSO, LSO and LYSO crystals. Since the oxygenation process requires adding oxygen into the crystal structure without destroying the crystal itself, it was determined that thermal diffusion might provide a suitable approach.

One should clearly differentiate between thermal annealing and thermal oxygenation processes, even though the basic tool to achieve both effects may be similar. Thermal annealing is a heat treatment process normally used in removing the stress within a crystal or to homogenize the physical or chemical properties of a crystal. Only thermal energy is needed for the process. Thermal annealing can be performed in air, in a vacuum, or in an inert gas, and regardless of the atmosphere there is no difference in the result since there is no chemical change induced within the crystal. A thermal oxygenation process, on the other hand, requires both thermal energy as well as the availability of oxygen. In essence, it is a thermal diffusion of oxygen into the crystal so as to eliminate the oxygen vacancy. Since oxygen is a fairly large molecule, under normal conditions it would not be possible to diffuse oxygen into the crystal structure. Therefore, to improve the diffusion process, heat is applied to the crystal to a certain temperature so that the atoms within the crystal structure are in a highly agitated state, which also increases the spacing of the atoms within the crystal lattice. This increased spacing in the crystal will also facilitate the diffusion of oxygen into the structure. So, in the thermal oxygenation process small amounts of oxygen are added to the crystal by diffusion. Since the diffusion of oxygen into the crystal is a very slow process, it would be of advantage to speed up the oxygenation. One approach would be to require at least one of the dimensions of the crystal to be small. In other words, the crystal is best shaped as a rod or a plate, and preferably should have the smallest dimension being no greater than 20 mm. Thicker samples may be oxygenated by the method of the invention, but the total time needed for oxygenation may be too long to be practical for commercial use.

It is possible to increase the temperature to facilitate the oxygenation process, however, increasing the temperature also increases the risk of oxidizing the Ce ion in the crystal from a 3+charge state to a 4+. When this occurs, the crystal turns a yellow color. Also, in the more highly oxidized state the $Ce^{4+}$ is no longer an emitting ion. Thus, the light yield of the crystal will be reduced as the total number of the emitting ions is reduced.

In testing the crystals produced, the light yield and energy resolution are measured using a standard photomultiplier tube (PMT) detector in a multi-channel analyzer (MCA). The sample to be measured is placed on the PMT detector and covered with a high reflectivity cup. On top of the cup, there is a radioactive source which will generate gamma rays. The typical radioactive sources used are Sodium$_{22}$ ($^{22}$Na), which produces 511 KeV gamma rays, and Cesium$_{137}$ ($^{137}$Cs), which produces 630 KeV gamma rays. The light yield and energy resolution are measured in the units of number of channels of the MCA. For calibration, NaI(Tl) and BGO are used as primary standards and then a calibrated sample of LYSO is used as a secondary standard. The detector system is set up in such a way that the maximum light output peak of BGO is set at 100 channels. Using this as the primary standard, the secondary LYSO standard will have the maximum light output peak located at 550 channels. In other words, the secondary standard light yield is 5.5 times more than that of BGO.

The MCA can also measure the energy spread around the maximum peak. It measures the full width half maximum (FWHM) of the energy peak again in unit of number of channels. For example, the LYSO secondary standard has a 10% energy resolution, and the FWHM of this standard is 55 channels. Before starting the measurement of crystal samples, the machine is first calibrated with the LYSO standard and adjusted so that the gain of the PMT will read exactly 550 channels. The MCA is then ready to read other test samples.

The following experimental examples have been conducted using the thermal oxygenation process on a variety of crystals previously prepared by the Czochralski melt pulling technique as known in the art. While a large number of sample crystals have now been treated according to the method of the invention, the examples provided below are representative.

EXAMPLE 1

A Ce:LYSO crystal having y=0.05 was cut into pixels of approximately 4×6×30 mm, resulting in ten individual samples which were then placed in an oven heated to 1100° C. for a period of 60 hours. The light yield (LY), the FWHM of the energy peak and energy resolution (ER %) before and after this thermal oxygenation process are listed in Table 1. It should also be understood that all test results shown in Tables 1–9 were measured at standard room temperature of approximately 25° C.

TABLE 1

| Sample # | 1 | 2 | 3 | 4 | 5 | 6 | 7 | 8 | 9 | 10 |
|---|---|---|---|---|---|---|---|---|---|---|
| Initial LY | 661 | 657 | 666 | 651 | 639 | 603 | 672 | 618 | 668 | 638 |
| FWHM | 115 | 117 | 79 | 102 | 77 | 75 | 82 | 82 | 81 | 62 |
| ER (%) | 17.4 | 17.8 | 11.9 | 15.7 | 12.1 | 12.4 | 12.2 | 13.3 | 12.1 | 9.7 |
| 60 hrs LY | 691 | 722 | 715 | 729 | 723 | 705 | 717 | 709 | 727 | 723 |
| FWHM | 61 | 63 | 64 | 66 | 61 | 54 | 60 | 62 | 61 | 62 |
| ER (%) | 8.8 | 8.7 | 9.0 | 9.1 | 8.4 | 7.7 | 8.4 | 8.7 | 8.4 | 8.6 |

The results show a general increase of LY following thermal oxygenation. More importantly, the energy resolution improves by at least 10%, after treatment.

EXAMPLE 2

A Ce:LSO crystal with y=0 is cut into pixels of approximately 6×6×25 mm and the samples were placed in an oven heated to 1100° C. for a period of 60 hours. The results are shown in Table 2. The initial pixel light yield was quite low, about 300, and the energy resolution was also poor. After thermal oxygenation, however, the pixel light yield has generally doubled and shifted to 600. The samples still retained their original light yield peak and the LY became doubled-peaked with an energy resolution more than twice of the original. It was apparent that the same oxygenation treatment is insufficient for LSO, when compared to LYSO. In view of the first results, it was decided to treat the samples for an additional 60 hours at 1100° C. Following this second treatment, there is a clear improvement for both light yield performance and energy resolution. However, the double peak has not been totally eliminated, and three of the samples show two distinctly separated peaks.

TABLE 2

| Sample # | 1 | 2 | 3 | 4 | 5 | 6 | 7 | 8 | 9 |
|---|---|---|---|---|---|---|---|---|---|
| Initial LY | 281 | 231 | 286 | 313 | 313 | 252 | 324 | 286 | 328 |
| FWHM | 38 | 37 | 54 | 46 | 44 | 40 | 71 | 52 | 61 |
| ER (%) | 13.5 | 16.0 | 18.9 | 14.7 | 14.1 | 15.9 | 21.9 | 18.2 | 18.6 |
| 60 hrs LY | 601 | 614 | 591 | 614 | 616 | 609 | 621 | 573 | 608 |
| FWHM | 133 | 172 | 163 | 136 | 114 | 142 | 128 | 168 | 119 |
| ER (%) | 22.1 | 28.0 | 27.6 | 22.1 | 18.5 | 23.3 | 20.6 | 29.3 | 19.6 |
| 120 hrs LY | 652 | 664 | dbl | dbl | 675 | 663 | 691 | dbl | 675 |
| FWHM | 116 | 144 | — | — | 105 | 120 | 106 | — | 107 |
| ER (%) | 17.8 | 21.7 | — | — | 15.6 | 18.1 | 15.3 | — | 15.9 |

These results show that even though thermal oxygenation can greatly improve both the light yield and energy resolution of pure LSO (y=0) crystal, the structure being less open, it is more difficult to achieve full oxygenation as compared with LYSO.

EXAMPLE 3

A Ce:YSO crystal with y=1.00 was cut into a small block of 6×6×10 mm and placed in an oven heated to 1100° C. for a period of 60 hours. The pixel has an initial light yield of 397 and an energy resolution of 10.6%. After the thermal oxygenation process, the crystal color turned to a light yellow, indicating conversion of at least part of the Ce dopant from the 3+ state to the 4+ state. $Ce^{3+}$ is an efficient blue emitter whereas $Ce^{4+}$ does not emit at all. Light yield measurement showed that the energy peak was located at 452 channels, which is better than before treatment, and that post-treatment energy resolution is 10.0%. While thermal oxygenation does improve the light yield in this case, the improvement is more limited. It also seems that the oxygen diffusion is more easily obtained in YSO than LYSO, with concomittant oxidation of the cerium dopant. These results indicated a need for shortening the treatment time to prevent oxidation of cerium in the crystal.

EXAMPLE 4

A thick Ce:LYSO crystal slab with y=0.05 and dimensions of 20 mm thick by 85 mm in diameter was treated in an oven heated to 1100° C. for a period of 60 hours. The slab had an initial light yield of 385 and FWHM of 52. After treatment, the crystal showed a double peak at 390 and 680.

It is thought that this effect is due to the limited diffusion depth of the oxygen so that only the outer skin region of the crystal is oxygenated, whereas the interior portion of the crystal still has original material with oxygen vacancies. This result indicates that pure thermal annealing will not change the light yield of the crystal. The interior portion of the crystal has undergone the same amount of heating but there is no detectable change in properties. Since the thermal oxygenation was not completed for the slab, the sample was placed back in the oven heated at 1100° C. for another 60 hours. Unfortunately, even after the second annealing, clear double peaks remained. These results led to the conclusion that since oxygen diffusion info the crystal is slow, it is difficult to oxygenate the interior of the sample when the crystal is too thick.

EXAMPLE 5

Temperature dependence of thermal oxygenation of Ce:LSO and Ce:LYSO crystals was tested using a special high temperature furnace capable of reaching a temperature of up to 1600° C. in air. Three sets of five identical pixels, each measuring 6×6×25 mm, were taken from a Ce:LSO crystal having y=0 and from a Ce:LYSO crystal having y=0.02. These sets of crystals were placed in furnaces and heated simultaneously, one set at 1400° C. for 30 hours, one set at 1300° C. for 50 hours, and one set at 1200° C. for 80 hours, respectively. The parameters for each pixel were measured before and after this thermal oxygenation treatment. The results are listed below:

TABLE 3

| At 1400° C. (Ln = LSO pixels, LYn = LYSO pixels, n = 1 to 5) | | | | | | | | | |
|---|---|---|---|---|---|---|---|---|---|
| Sample # | L1 | L2 | L3 | L4 | L5 | LY1 | LY2 | LY3 | LY4 | LY5 |
| Initial LY | 403 | 338 | 353 | 415 | 349 | 510 | 455 | 465 | 484 | 485 |
| FWHM | 43.5 | 42.0 | 42.6 | 44.3 | 68.0 | 47.1 | 54.0 | 45.6 | 47.7 | 46.5 |
| ER (%) | 10.8 | 12.4 | 12.1 | 10.7 | 19.5 | 9.2 | 11.9 | 9.8 | 9.9 | 9.6 |
| 30 hrs LY | 615 | 613 | 615 | 607 | 579 | 585 | 595 | 606 | 602 | 606 |
| FWHM | 57.5 | 61.3 | 57.6 | 63.9 | 64.2 | 48.1 | 48.6 | 45.7 | 48.1 | 45.1 |
| ER (%) | 9.3 | 10.0 | 9.4 | 10.5 | 11.1 | 8.2 | 8.2 | 7.5 | 8.0 | 7.4 |

TABLE 4

At 1300° C. (Ln = LSO pixels, LYn = LYSO pixels, n = 6 to 10)

| Sample # | L6 | L7 | L8 | L9 | L10 | LY6 | LY7 | LY8 | LY9 | LY10 |
|---|---|---|---|---|---|---|---|---|---|---|
| Initial LY | 413 | 412 | 378 | 389 | 318 | 451 | 490 | 485 | 467 | 486 |
| FWHM | 41.9 | 45.2 | 42.2 | 42.1 | 40.3 | 44.0 | 47.0 | 48.5 | 46.2 | 46.9 |
| ER (%) | 10.1 | 11.0 | 11.2 | 10.8 | 12.7 | 9.8 | 9.6 | 10.0 | 9.9 | 9.7 |
| 50 hrs LY | 627 | 618 | 605 | 617 | 641 | 623 | 620 | 635 | 633 | 629 |
| FWHM | 81.0 | 87.8 | 85.5 | 81.3 | 67.2 | 49.4 | 48.9 | 46.6 | 48.2 | 46.3 |
| ER (%) | 12.9 | 14.2 | 14.1 | 13.2 | 10.5 | 7.9 | 7.9 | 7.3 | 7.6 | 7.4 |

TABLE 5

At 1200° C. (Ln = LSO pixels, LYn = LYSO pixels, n = 11 to 15)

| Sample # | L11 | L12 | L13 | L14 | L15 | LY11 | LY12 | LY13 | LY14 | LY15 |
|---|---|---|---|---|---|---|---|---|---|---|
| Initial LY | 309 | 357 | 418 | 372 | 328 | 476 | 507 | 454 | 480 | 467 |
| FWHM | 34.9 | 40.5 | 45.2 | 42.8 | 67.7 | 49.2 | 48.1 | 46.0 | 46.6 | 46.9 |
| ER (%) | 11.3 | 11.3 | 10.8 | 11.5 | 20.6 | 10.3 | 9.5 | 10.1 | 9.7 | 10.0 |
| 80 hrs LY | 541 | 578 | 598 | 554 | 557 | 599 | 600 | 614 | 614 | 610 |
| FWHM | 97.5 | 96.8 | 107.7 | 104.8 | 100.0 | 46.7 | 46.9 | 45.7 | 47.6 | 44.3 |
| ER (%) | 18.0 | 16.7 | 18.0 | 18.9 | 18.0 | 7.8 | 7.8 | 7.4 | 7.8 | 7.3 |

It is apparent from the result that oxygen diffusion is far more effective at higher temperatures. Between Ce:LSO and Ce:LYSO, the latter was much easier to be fully oxygenated during a much shorter treatment time. At 1400° C., it was possible to fully oxygenate both Ce:LSO and Ce:LYSO in 30 hours. After full oxygenation, there was great improvement in light yield (LY) and energy resolution (ER %) for both crystals. Moreover, even though the as-grown Ce:LYSO had distinctly better light yield and energy resolution as compared with Ce:LSO, once fully oxygenated there was substantially no difference in light yield between these two crystals. However, the overall energy resolution of Ce:LYSO was distinctly better than that of Ce:LSO, even when both were fully oxygenated. Still, for Ce:LSO, the energy resolution was also greatly improved after thermal oxygenation. For example, Sample L5 with initial LY of 349 and Er 19.5% can be improved to LY of 579 and ER 11.1% with full oxygenation.

EXAMPLE 6

Using the same high temperature furnace as in Example 5, we investigated the complete range of composition of YSO, LYSO and LSO family compounds. Pixels made from seven specific compositions were used for the thermal oxygenation test. They were pure YSO (y=1.00), LYSO with 15% Lu (y=0.85), LYSO with 30% Lu (y=0.70), LYSO with 50% Lu (y=0.50), LYSO with 70% Lu (y=0.30), LYSO with 85% Lu (y=0.15) and pure LSO (y=0). All pixels had their smallest dimension being approximately no less than 6 mm. Thermal oxygenation temperatures and durations were 1400° C. for 30 hours, 1300° C. for 50 hours, 1200° C. for 80 hours and 1100° C. for 120 hours, respectively in order to compare the results with Example 5. Each pixel was measured before and after the thermal oxygenation. The results are listed below:

TABLE 6

At 1400° C. (YSO, LSO = pure compound, n % = % of Lu content in LYSO)

| Sample # | YSO-1 | YSO-2 | 15% | 30% | 50% | 70% | 85% | LSO |
|---|---|---|---|---|---|---|---|---|
| Initial LY | 386 | 506 | 232 | 407 | 469 | 387 | 449 | 320 |
| FWHM | 29.6 | 41.7 | 45.1 | 35.8 | 47.2 | 35.7 | 57.4 | 39.3 |
| ER (%) | 7.7 | 8.2 | 19.4 | 8.8 | 10.1 | 9.2 | 12.8 | 12.3 |
| 30 hrs LY | 408 | 448 | 348 | 549 | 570 | 607 | 644 | 657 |
| FWHM | 31.3 | 35.9 | 54.0 | 41.4 | 44.3 | 46.9 | 48.3 | 57.0 |
| ER (%) | 7.7 | 8.0 | 15.5 | 7.5 | 7.8 | 7.7 | 7.5 | 8.7 |

TABLE 7

At 1300° C. (YSO, LSO = pure compound, n % = % of Lu content in LYSO)

| Sample # | YSO-1 | YSO-2 | 15% | 30% | 50% | 70% | 85% | LSO |
|---|---|---|---|---|---|---|---|---|
| Initial LY | 447 | 453 | 233 | 430 | 466 | 450 | 462 | 398 |
| FWHM | 34.5 | 35.5 | 45.1 | 44.7 | 52.1 | 53.6 | 68.5 | 45.7 |
| ER (%) | 7.7 | 7.8 | 19.4 | 10.4 | 11.2 | 11.9 | 14.8 | 11.5 |
| 30 hrs LY | 460 | 464 | 352 | 566 | 586 | 625 | 636 | 628 |
| FWHM | 35.8 | 31.9 | 36.2 | 41.9 | 51.1 | 46.8 | 46.9 | 87.4 |
| ER (%) | 7.8 | 6.9 | 10.3 | 7.4 | 8.7 | 7.5 | 7.4 | 13.9 |

TABLE 8

At 1200° C. (YSO, LSO = pure compound, n % = % of Lu content in LYSO)

| Sample # | YSO-1 | YSO-2 | 15% | 30% | 50% | 70% | 85% | LSO |
|---|---|---|---|---|---|---|---|---|
| Initial LY | 498 | 412 | 262 | 477 | 520 | 542 | 473 | 420 |
| FWHM | 37.5 | 36.7 | 33.3 | 46.4 | 54.8 | 61.1 | 57.5 | 69.9 |
| ER (%) | 7.5 | 8.9 | 12.7 | 9.7 | 10.5 | 11.3 | 12.2 | 16.6 |
| 30 hrs LY | 459 | 422 | 361 | 579 | 604 | 625 | 644 | 623 |
| FWHM | 31.2 | 35.2 | 39.9 | 36.6 | 44.3 | 44.6 | 50.6 | 97.8 |
| ER (%) | 6.8 | 8.3 | 11.1 | 6.3 | 7.3 | 7.1 | 7.9 | 15.7 |

TABLE 9

At 1100° C. (YSO, LSO = pure compound, n % = % of Lu content in LYSO)

| Sample # | YSO-1 | YSO-2 | 15% | 30% | 50% | 70%-1 | 70%-2 | 85%-1 | 85%-2 | LSO |
|---|---|---|---|---|---|---|---|---|---|---|
| Initial LY | 441 | 453 | 250 | 473 | 512 | 525 | 520 | 442 | 500 | 384 |
| FWHM | 33.0 | 35.3 | 36.3 | 42.3 | 54.8 | 65.1 | 48.3 | 46.3 | 49.8 | 84.0 |
| ER (%) | 7.5 | 7.8 | 14.5 | 8.9 | 10.7 | 12.4 | 9.3 | 10.5 | 10.0 | 21.9 |
| 30 hrs LY | 490 | 466 | 349 | 582 | 621 | 618 | 646 | 646 | 671 | 607 |
| FWHM | 31.3 | 32.0 | 44.9 | 40.1 | 48.8 | 49.7 | 47.5 | 47.7 | 46.4 | 102.3 |
| ER (%) | 6.4 | 6.9 | 12.9 | 6.9 | 7.9 | 8.0 | 7.4 | 7.5 | 6.9 | 16.9 |

For a pure LSO pixel, the results were the same as those in Example 5. Only at 1400° C., was it possible to fully oxygenate LSO. At lower temperatures, the light yield improved somewhat but the energy resolution increased. For pure YSO, the results were consistent with Example 3. All the YSO pixels turned to a light yellow in color following oxygenation at any of the temperatures used, indicating the oxidation of $Ce^{3+}$ to $Ce^{4+}$. However, despite the loss of some active emission centers of $Ce^{3+}$ there seemed to be no significant decrease in light yield nor change in energy resolution (ER). For LYSO pixels, the result is also very consistent. No pixels showed signs of discoloration, even for 15% LYSO at 1400° C. The 15% LYSO, which has the highest Yttrium content of 85%, started with very poor light yield and energy resolution, and achieved a 50% improvement in light yield after thermal oxygenation. The energy resolution also improved, except at the highest temperature. For the remaining LYSO compositions, thermal oxygenation was completed at all temperatures tested. All samples showed an increase in light yield and a decrease in energy resolution. Moreover, there was a systematic increase in final light yield with increasing Lutetium content in the crystal.

Thermal oxygenations at 1300° C. and 1200° C. showed that Ce:LYSO pixels were fully oxygenated during the respective heating times, but that Ce:LSO pixels did not reach full oxygenation. This was consistent with the thermal treatment results obtained at 1100° C. and indicated that the active energy of oxygen diffusion for Ce:LSO is much higher than that for Ce;LYSO, so that much longer times are needed to fully oxygenate Ce:LSO. Once fully oxygenated, however, the Ce:LSO pixels were functionally close to Ce:LYSO with only slightly higher energy resolution.

Applicant hypothesizes, without wishing to be bound thereto, that the large differences in response during thermal oxygenation are due to the effect of the crystal's physical properties. That is, comparing Ce:LSO with Ce:LYSO, Applicant has found that with as small as approximately a 2% content of Yttrium in Ce:LYSO, the crystal will show significant improvement in oxygen diffusion, as well as a narrowing of the energy resolution as compared to that of pure Ce:LSO. This feature distinguishes pure Ce:LSO from Ce:LYSO. Ease of oxygenation increases with increasing Yttrium content in Ce:LYSO. At the same time, however, the tendency to oxidize Ce from 3+ state to 4+ state also increases with higher Yttrium content. It is, therefore, necessary to carefully control both the time and temperature during thermal oxygenation of a specific crystal composition in order to maximize light yield from the crystal without further oxidizing the Ce component in the crystal.

EXAMPLE 7

We have also examined the effect of thermal oxygenation on the light yield of Ce:LSO and Ce:LYSO as a function of temperature. We randomly selected two Ce:LSO pixels and two Ce:LYSO (y=0.05) pixels. One of each is as-grown without thermal oxygenation. The other two are fully oxygenated Ce:LSO and Ce:LYSO. The samples were chilled or heated at different temperatures. Both light yield and energy resolution were measured at these temperatures. The results are shown in Table 10, below.

TABLE 10

Temperature Dependence of Light Yield Measurement:

| Sample | Centroid | FWHM | Energy R | T (° C.) | Δ |
|---|---|---|---|---|---|
| BGO | 100 | 11.45 | 11.45 | 23 | |
| LSO (untreated) | 486 | 50.57 | 10.4 | 2 | 100 |
| LSO (untreated) | 462 | 51.77 | 11.2 | 23 | 95.1 |
| LSO (untreated) | 452 | 37.96 | 8.4 | 41 | 93.0 |
| LSO (untreated) | 420 | 31.16 | 7.4 | 56 | 86.4 |
| LSO (oxygenated) | 685 | 48.93 | 7.1 | 2 | 100 |
| LSO (oxygenated) | 665 | 42.50 | 6.4 | 23 | 97.1 |
| LSO (oxygenated) | 676 | 49.18 | 7.3 | 41 | 98.7 |
| LSO (oxygenated) | 658 | 37.49 | 5.7 | 56 | 96.1 |
| LYSO (untreated) | 521 | 32.91 | 6.3 | 2 | 100 |
| LYSO (untreated) | 465 | 35.43 | 7.6 | 23 | 89.3 |
| LYSO (untreated) | 447 | 25.57 | 5.7 | 41 | 85.8 |
| LYSO (untreated) | 376 | 42.61 | 11.3 | 56 | 72.2 |
| LYSO (oxygenated) | 708 | 47.26 | 6.7 | 2 | 100 |
| LYSO (oxygenated) | 701 | 50.07 | 7.1 | 23 | 99.0 |
| LYSO (oxygenated) | 692 | 42.97 | 6.2 | 41 | 97.7 |
| LYSO (oxygenated) | 678 | 41.53 | 6.1 | 56 | 95.8 |

Crystal performance was measured at four temperatures: 2°, 23°, 41° and 56°, respectively. It was found that both as-grown Ce:LSO and Ce:LYSO have defect centers due to oxygen deficiency. These defect centers can act as non-radiative emission centers which will take the scintillating energy away from emission. Non-radiative energy loss increased with temperature. For Ce:LSO, there was a drop of 14% in light yield from 2° to 56° C. For Ce:LYSO, which is more easily diffused with oxygen, the drop is doubled to 28% over the same temperature range. However, after thermal oxygenation, these oxygen deficiency defects were eliminated. Both Ce:LSO and Ce:LYSO when fully oxygenated showed the same low temperature dependence of light yield, a drop of only about 4% over the same temperature range.

The results show that thermal oxygenation is an important post crystal growth process to restore Ce:LSO, Ce:LYSO and Ce:YSO to their full intrinsic scintillation properties. Without thermal oxygenation the as-grown crystals, even those within the same batch, will demonstrate large variations and inconsistent behavior in their light emission properties during the scintillation process.

The results also support the proposition that LYSO may be a preferred candidate crystal in the process of the invention. Moreover, since the treatment is a thermal diffusion process, it may be desirable to have at least one of the dimensions of the crystal sample be sufficiently small so as to shorten the oxygen diffusion path to effectively eliminate oxygen vacancy defects and increase the energy resolution of the crystals. Thermal diffusion of oxygen into these crystals can be improved at higher temperatures. However, increasing the temperature also increases the risk of excessive oxygenation of the crystal, resulting in oxidation of the $Ce^{3+}$ ion into the $Ce^{4+}$ non-emitting state. Once the cerium has been oxidized, the non-emitting atom will impair the light emitting center and will drastically affect the light yield of the crystal.

Figure 3:
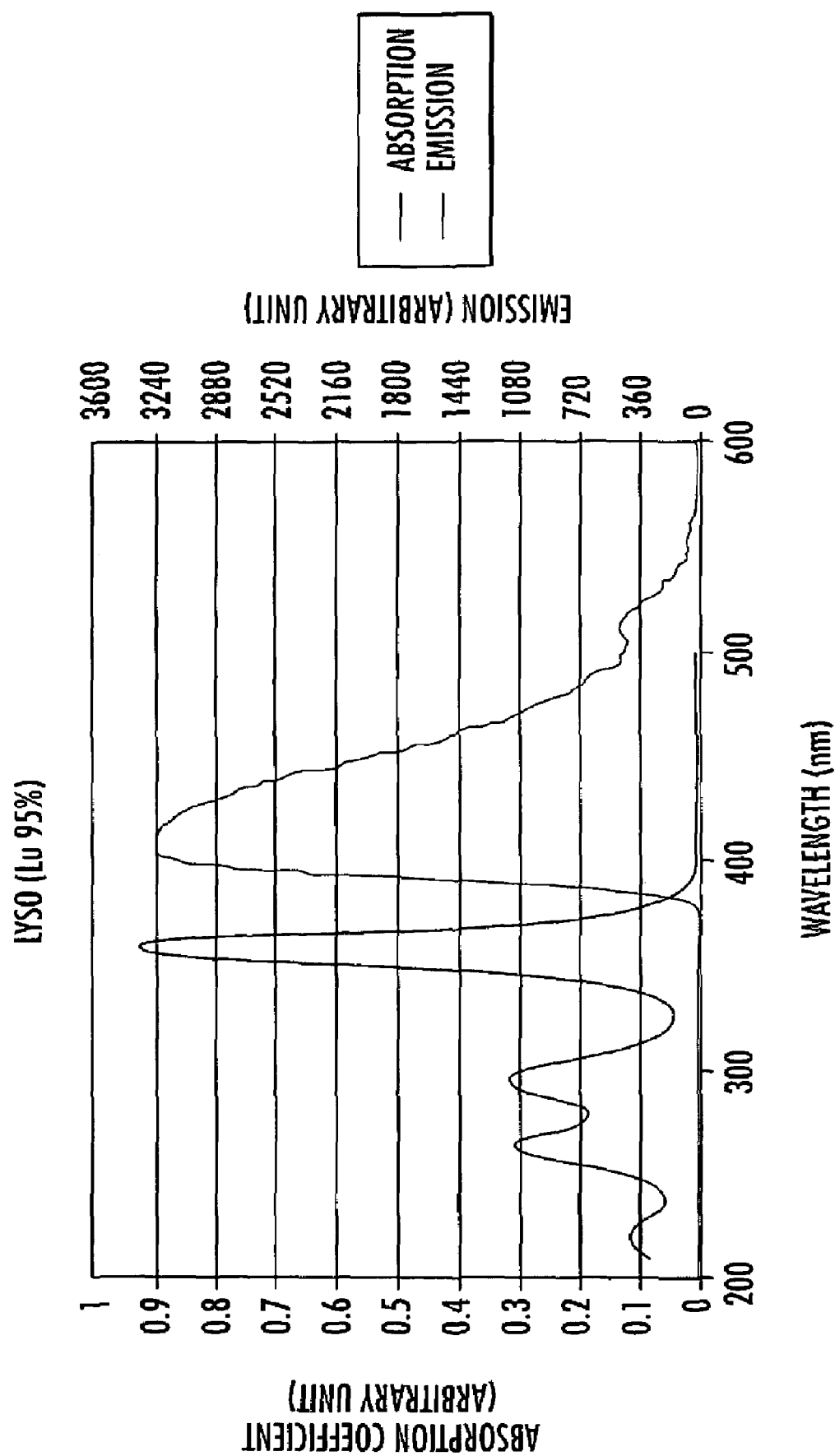
FIG. 3 is a line graph showing the absorption and emission spectra of LYSO, as in the prior art.
Figure 4:
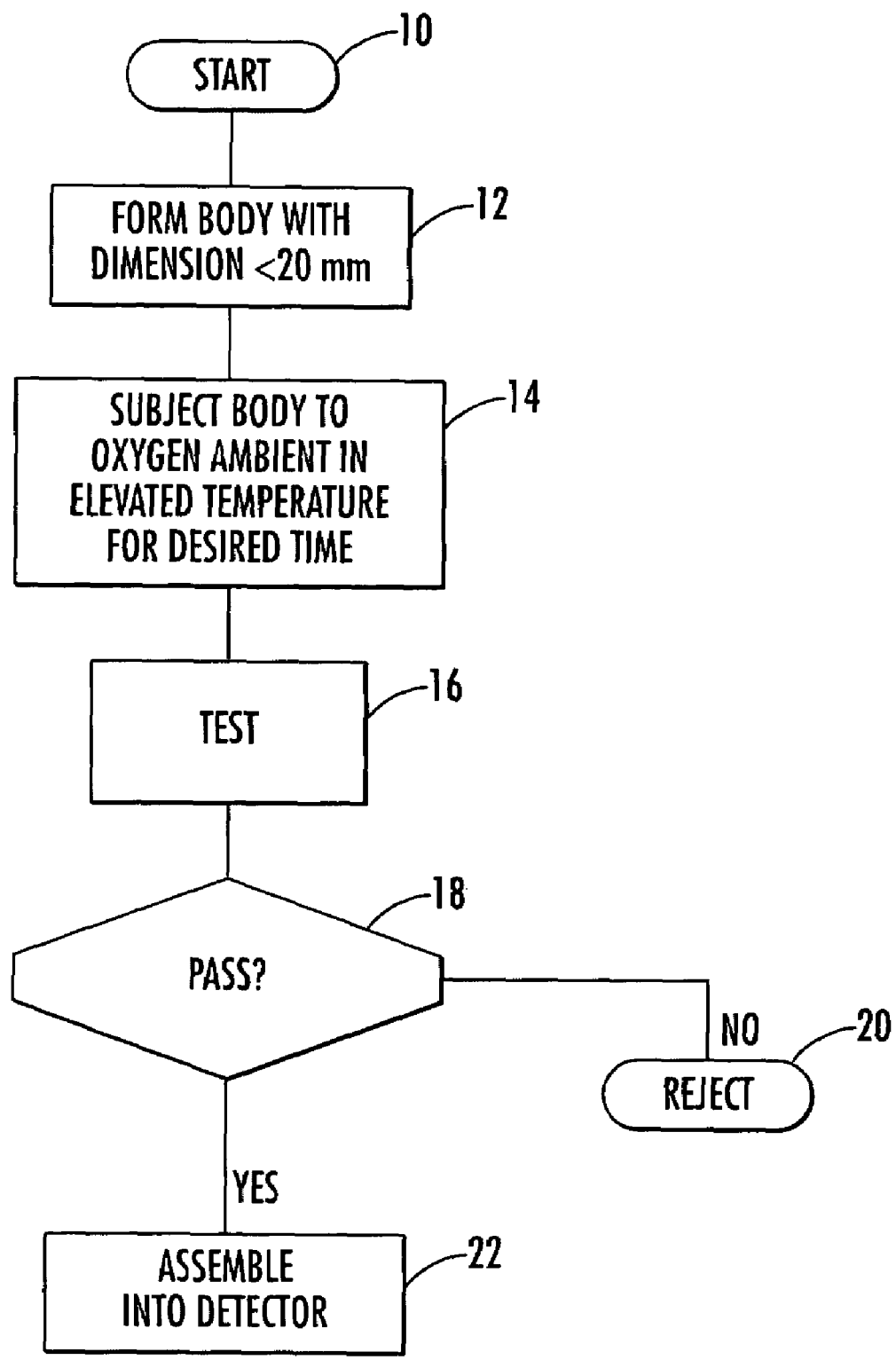
FIG. 4 is a flow diagram showing the method of the invention.
Figure 5:
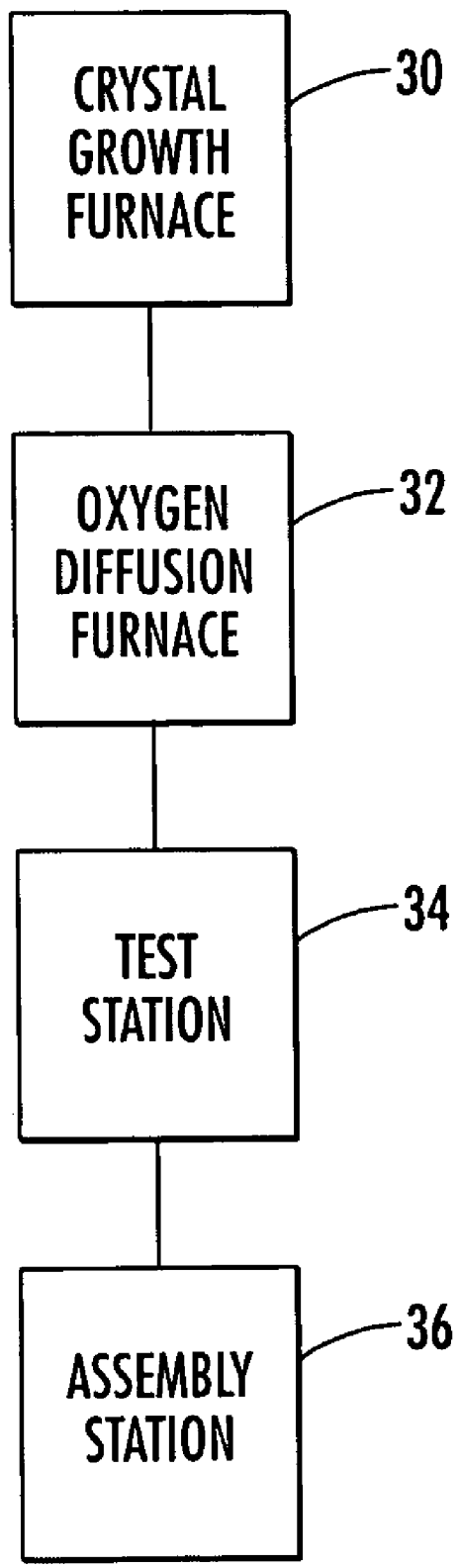
FIG. 5 illustrates an overall industrial process employing the present invention.
Figure 6:
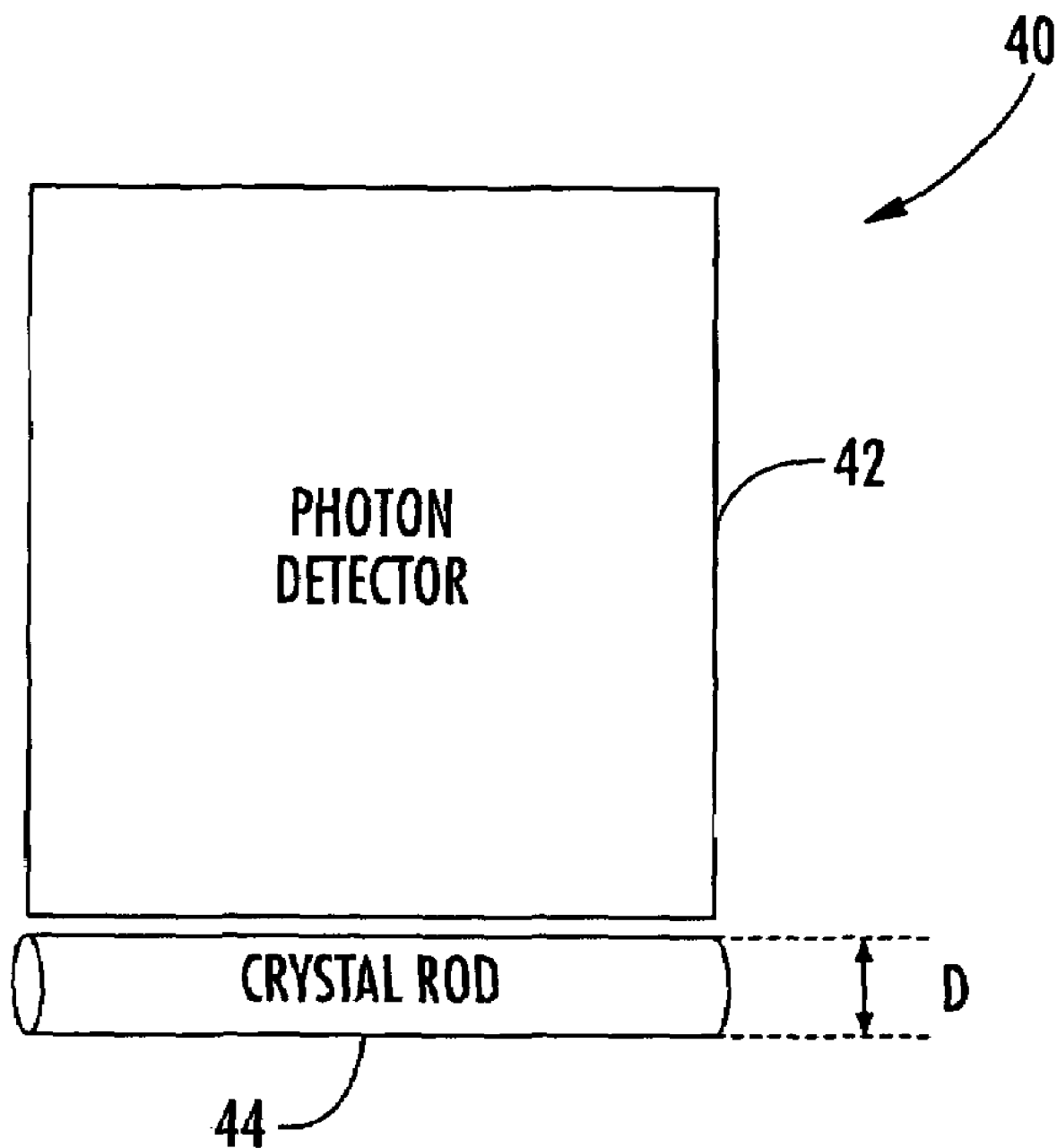
FIG. 6 is a schematic diagram of a scintillation detector employing a rod-shaped crystal enhanced according to the invention.
Figure 7:
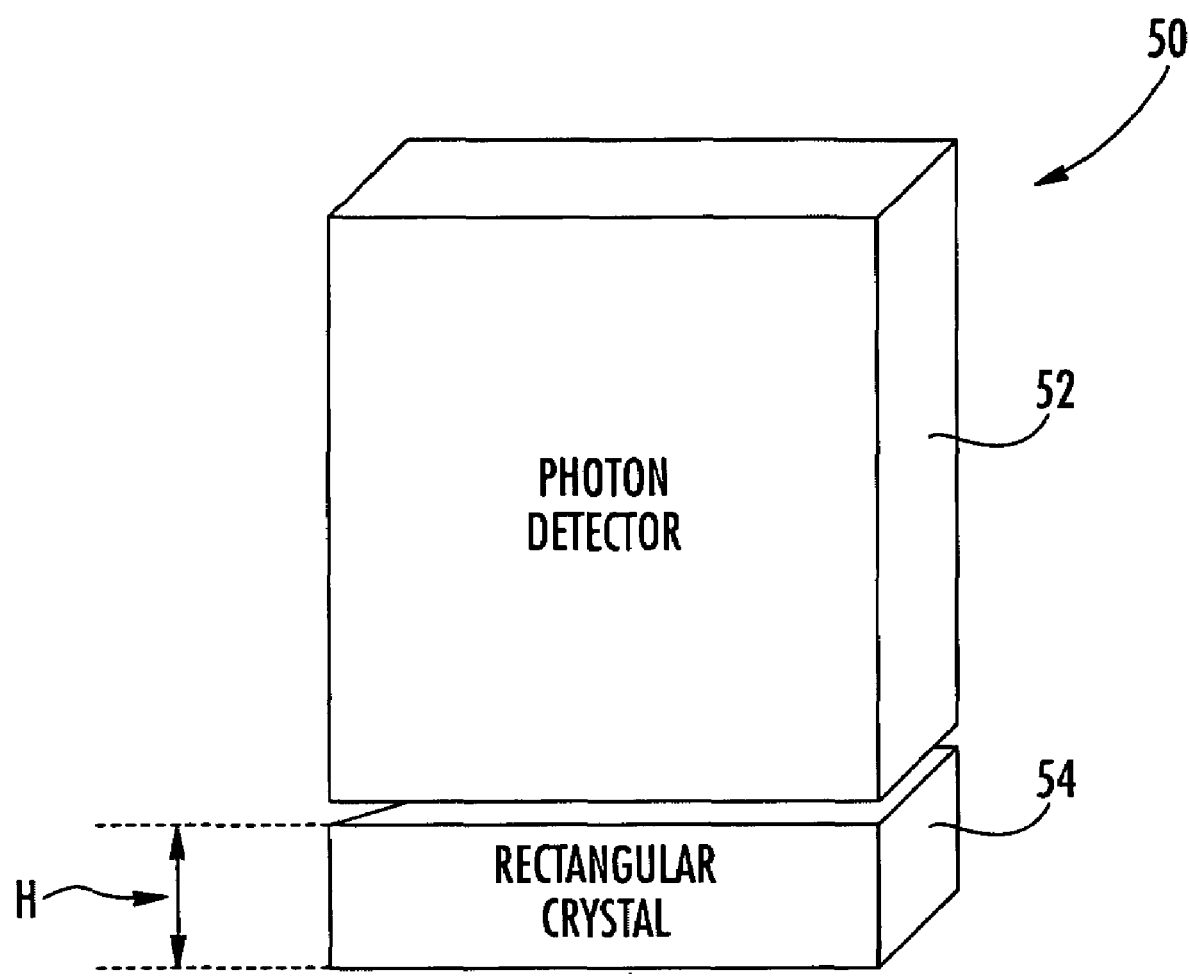
FIG. 7 shows a schematic diagram of a scintillation detector employing a rectangular crystal enhanced according to the invention.

Referring now to the figures to further illustrate the invention, FIG. 3 is a flow diagram generally showing the process of the invention as described. From the start 10 a crystal body is formed 12 having preferably at least one dimension of 20 mm or less. The crystal body is heated 14 in an oxygen ambient for a desired time. Following oxygenation, the crystal is tested 16 to determine whether its light yield has been sufficiently improved and is either passed 18 or rejected 20. Crystals which pass are then assembled into scintillation detectors 22. FIG. 4 generally illustrates the overall industrial process stations in which the invention is incorporated. A crystal is grown in a crystal growth furnace 30. The as-grown crystal is then placed in an oxygen diffusion furnace 32 for oxygenation. Following oxygenation, the crystal proceeds to a test station 34, where it is evaluated for its light yield performance. A crystal meeting performance requirements is then directed to an assembly station 36, where it is assembled into a scintillation detector. FIG. 5 shows a typical scintillation detector 40, which includes at least a photon detector 42 and a crystal 44 enhanced according to the invention. In this case, the crystal shown is a rod-shaped crystal, having a predetermined diameter D of a dimension suitable for oxygenation. FIG. 6 illustrates another scintillation detector 50, which includes a photon detector 52 and, in this case, a rectangular crystal 54 enhanced by the process of the present invention. The rectangular crystal has a predetermined height H of a dimension suitable for oxygenation according to the invention.

Accordingly, in the drawings and specification there have been disclosed typical preferred embodiments of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

What is claimed is:

1. A method of enhancing performance of a body of monocrystalline cerium doped lutetium yttrium orthosilicate (LYSO) in response to irradiation with high energy radiation, the method comprising:
   diffusing oxygen into the body of monocrystalline LYSO by heating the body for a period of time in an ambient containing oxygen.

2. The method of claim 1, wherein diffusing is carried out so that the body of monocrystalline LYSO is fully oxygenated.

3. The method of claim 1, wherein diffusing is carried out so that the cerium is not further oxidized to a 4+ state.

4. The method of claim 1, wherein diffusing is carried out so that the body of monocrystalline LYSO is not visually yellow in color.

5. The method of claim 1, further comprising forming the body of monocrystalline LYSO to have at least one dimension no greater than approximately 20 mm.

6. The method of claim 5, wherein forming the body comprises forming the body to have a rod shape.

7. The method of claim 5, wherein forming the body comprises forming the body to have a rectangular shape.

8. The method of claim 1, wherein the oxygen containing ambient comprises air at atmospheric pressure.

9. The method of claim 1, wherein the oxygen containing ambient is at a pressure above atmospheric.

10. The method of claim 1, wherein the oxygen containing ambient has an oxygen concentration higher than in air.

11. The method of claim 1, wherein heating the body of monocrystalline LYSO comprises heating the body to a temperature in a range of between approximately 1100° to 1400° C.

12. The method of claim 1, wherein heating the body of monocrystalline LYSO comprises heating the body to a temperature of approximately 1100° C.

13. The method of claim 1, wherein the period of time is in a range of approximately 30 to 120 hours.

14. The method of claim 1, wherein the period of time is in a range of approximately 30 to 100 hours.

15. The method of claim 1, wherein prior to being enhanced the LYSO single crystal consists of $Ce_{2x}(Lu_{1-y}Y_y)_{2(1-x)}SiO_{5-z}$ where x ranges from approximately 0.00001 to approximately 0.05, y ranges from approximately greater than 0 to approximately less than 1.00, and z ranges from greater than 0 to less than 5.

16. The method of claim 1, wherein the diffusing results in increased performance based upon a light yield of the body of monocrystalline LYSO.

17. The method of claim 1, wherein the diffusing results in increased performance based upon an improved energy resolution of the body of monocrystalline LYSO.

18. The method of claim 1, wherein the diffusing results in increased performance based upon at least a 10% improvement in the energy resolution of the monocrystalline body.

19. A method of enhancing performance of a body of monocrystalline cerium doped lutetium yttrium orthosilicate (LYSO) in response to irradiation with high energy radiation, the body of monocrystalline LYSO having oxygen vacancies therein, the method comprising:
   supplying oxygen to fill at least some of the oxygen vacancies in the body of monocrystalline LYSO.

20. The method of claim 19, wherein supplying is carried out so that the body of monocrystalline LYSO is fully oxygenated.

21. The method of claim 19, wherein supplying is carried out so that the cerium is not further oxidized to a 4+ state.

22. The method of claim 19, wherein supplying is carried out so that the body of monocrystalline LYSO is not visually yellow in color.

23. The method of claim 19, further comprising forming the body of monocrystalline LYSO to have at least one dimension no greater than approximately 20 mm.

24. The method of claim 19, wherein supplying comprises exposing the body of monocrystalline LYSO to air at atmospheric pressure, and at an elevated temperature.

25. The method of claim 24, wherein supplying the elevated temperature is in a range of between approximately 1100° to 1400° C.

26. The method of claim 24, wherein the exposing is for period of time in a range of approximately 30 to 120 hours.

27. The method of claim 19, wherein prior to being enhanced the LYSO single crystal consists of $Ce_{2x}(Lu_{1-y}Y_y)_{2(1-x)}SiO_{5-z}$ where x ranges from approximately 0.00001 to approximately 0.05, y ranges from approximately greater than 0 to approximately less than 1.00, and z ranges from greater than 0 to less than 5.

28. The method of claim 19, wherein the diffusing results in increased performance based upon at least one of a light yield of the body of monocrystalline LYSO; and an energy resolution of the body of monocrystalline LYSO.

* * * * *

UNITED STATES PATENT AND TRADEMARK OFFICE
CERTIFICATE OF CORRECTION

PATENT NO. : 7,166,845 B1 Page 1 of 1
APPLICATION NO. : 10/754850
DATED : January 23, 2007
INVENTOR(S) : Bruce Chai It is certified that error appears in the above-identified patent and that said Letters Patent is hereby corrected as shown below:

| | |
|---|---|
| Title Page, Item 75 | Delete: "Sanford, FL" <br> Insert: --Oviedo, FL-- |
| Column 3, Line 29 | Delete: "C., 2150° C. and 210° C.," <br> Insert: -- C, 2150°C and 2100°C,-- |
| Column 4, Line 3 | Delete: "crystals, I" <br> Insert: --crystals, Applicant-- |
| Column 4, Lines 48 | Delete: "to 1400° C., and," <br> Insert: --to 1400° C, and,-- |
| Column 8, Line 9 | Delete: "in unit of" <br> Insert: --in units of-- |
| Column 12, Line 52 | Delete: "30 hrs LY" <br> Insert: --50 hrs LY-- |
| Column 12, Line 63 | Delete: "30 hrs LY" <br> Insert: --80 hrs LY-- |
| Column 13, Line 8 | Delete: "30 hrs LY" <br> Insert: --120 hrs LY-- |
| Column 13, Line 46 | Delete: "Ce;LYSO," <br> Insert: -- Ce:LYSO,-- |

Signed and Sealed this

Twenty-first Day of August, 2007

JON W. DUDAS
*Director of the United States Patent and Trademark Office*